United States Patent [19]

Jeremias et al.

[11] Patent Number: 4,912,153

[45] Date of Patent: Mar. 27, 1990

[54] ONE COMPONENT POLYSILOXANE RTV COMPOSITIONS HARDENING WITH ELIMINATION OF OXIMES

[75] Inventors: Jörg Jeremias, Bergisch Gladbach; Hans G. Metzinger; Krystyna Preuss, both of Leverkusen; Wilhelm Weber, Cologne, all of Fed. Rep. of Germany

[73] Assignee: Bayer Aktiengesellschaft, Leverkusen, Fed. Rep. of Germany

[21] Appl. No.: 258,538

[22] Filed: Oct. 17, 1988

[30] Foreign Application Priority Data

Oct. 29, 1987 [DE] Fed. Rep. of Germany ....... 3736654

[51] Int. Cl.$^4$ .............................................. C08K 5/24
[52] U.S. Cl. .................................... 524/731; 524/788; 524/789; 524/791; 524/860; 528/18
[58] Field of Search .................. 528/18; 524/731, 788, 524/789, 791, 860

[56] References Cited

U.S. PATENT DOCUMENTS

| | | | |
|---|---|---|---|
| 3,032,528 | 5/1962 | Nitzsche et al. | 528/34 |
| 3,962,160 | 6/1976 | Beers et al. | 528/34 |
| 4,356,116 | 10/1982 | Beers | 528/18 |
| 4,448,928 | 5/1984 | Klein et al. | 528/18 |
| 4,514,329 | 4/1985 | Beers et al. | 524/773 |
| 4,720,530 | 1/1988 | Wurminghausen et al. | 528/18 |

Primary Examiner—Melvyn I. Marquis
Attorney, Agent, or Firm—Sprung Horn Kramer & Woods

[57] ABSTRACT

Polyorganosiloxane compositions which can be stored in the absence of moisture and which harden rapidly in the presence of moisture, comprising a mixture of
(1) 100 parts by weight of an $\alpha,\omega$-dihydroxypolydimethylsiloxane having a viscosity of from 0.1 to 1000 Pas,
(2) 0 to 100 parts by weight of an $\alpha,\omega$-bis-(trimethylsiloxy)-polydimethylsiloxane having a viscosity of from 0.04 to 10 Pas as plasticizer,
(3) 1 to 10 parts by weight of an oximinosilane corresponding to the following formula

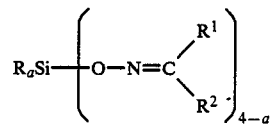

in which
R preresents $C_1$–$C_4$ alkyl or alkenyl radicals,
$R^1$ and $R^2$ each represent a $C_1$–$C_4$ alkyl radical or hydrogen or $R^1$ and $R^2$ together represent a $C_4$ or $C_5$ alkylene radical and a may assume the value 0 or 1,
(4) 5 to 250 parts by weight of a reinforcing or non-reinforcing filler of filler mixture,
(5) 0 to 2.5 parts by weight of an aminoalkyl alkoxysilane containing one or more basic nitrogen atoms attached to a silicon through at least 3 C atoms and
(6) 0.01 to 0.5 part by weight tin in the form of a tin catalyst, wherein the tin catalyst is a solution of dialkyltin oxides corresponding to the following formula

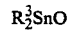

in which
$R^3$ may represent a linear or branched $C_3$–$C_{18}$ alkyl radical, in aminoalkyl alkoxysilanes.

1 Claim, No Drawings

ONE COMPONENT POLYSILOXANE RTV COMPOSITIONS HARDENING WITH ELIMINATION OF OXIMES

This invention relates to one-component silicone pastes which harden in contact with atmospheric moisture with elimination of oximes, adhere firmly to many substrates, show high stability in storage and favorable mechanical properties in the vulcanized state and do not attack metal surfaces, particularly copper.

One of the known methods of producing moisture-hardening silicone pastes is based on the use of oximinosilanes. Silanes of this type are described in U.S. Pat. No. 3,189,576. $\alpha,\omega$-di-hydroxypolydimethylsiloxanes are mixed with the particular oximinosilane and, optionally, one or more fillers. This gives cold-hardening systems (so-called RTV systems) which can be stored in the absence of atmospheric moisture and which harden under the effect of atmospheric moisture to form an elastomer, so-called oxime systems.

In addition, it is known that the crosslinking of oxime systems can be accelerated by metal catalysts, particularly dialkyltin carboxylates. In addition, the use of aminoalkyl alkoxysilanes, for example $H_2N$ $CH_2CH_2CH_2$ $Si(OC_2H_5)_3$ or $H_2N$ $CH_2CH_2$ $NH$ $CH_2CH_2CH_2Si(OCH_3)_3$, has been described for sealing applications. Silanes such as these improve adhesion to many substrates. Systems prepared from $\alpha,\omega$-dihydroxypolydimethylsiloxanes, oximinosilanes, aminoalkyl alkoxysilanes, dialkyltin dicarboxylates and fillers, are the subject of Japanese patent application 46-11272.

Another patent, EP-PS 90 409, describes formulations similar to those disclosed in the Japanese patent application cited above. These formulations include tin catalysts which are formed by the reaction of dialkyltin dicarboxylates with alkoxysilane with elimination of carboxylic acid esters.

Finally, DE-PS 35 24 452 describes oxime systems which, in addition to aminoalkyl alkoxysilanes and dibutyltin dicarboxylates, contain relatively small quantities of carboxylic acids or silane derivatives thereof. These additives accelerate crosslinking under the effect of atmospheric moisture.

The products obtainable in accordance with the prior art have disadvantages. Thus, altough the formulations according to Japanese patent No. 46-11272 or to German patent DE-PS No. 35 24 452, which contain dialkyltin dicarboxylates, may be used as sealants, they do produce discoloration and other corrosion phenomena on metals, particularly copper.

Formulations according to European patent No. 90 409 behave more favorably when applied to copper surfaces. However, these formulations often show limited storability in the unvulcanized state.

Accordingly, the object of the present invention is to provide oxime systems which show good stability in storage and which do not attack metal surfaces, particularly copper.

The present invention relates to polyorganosiloxane compositions which can be stored in the absence of moisture and which harden rapidly in the presence of moisture, obtainable by mixing of (1) 100 parts by weight of an $\alpha,\omega$-dihydroxypolydimethyl(1) siloxane having a viscosity of from 0.1 to 1000 Pas, (2) 0 to 100 parts by weight of an $\alpha,\omega$-bis-(trimethylsiloxy)-polydimethylsiloxane having a viscosity of from 0.04 to 10 Pas as plasticizer, (3) 1 to 10 parts by weight of an oximinosilane corresponding to the following formula

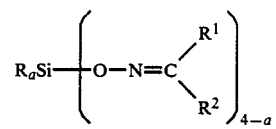

in which

R represents $C_1$–$C_4$ alkyl or alkenyl radicals, $R^1$ and $R^2$ each represent a $C_1$–$C_4$ alkyl radical or hydrogen or $R^1$ and $R^2$ together represent a $C_4$ or $C_5$ alkylene radical and a may assume the value 0 or 1, (4) 5 to 250 parts by weight of a reinforcing or non-reinforcing filler or filler mixture, (5) 0 to 2.5 parts by weight of an aminoalkyl alkoxysilane containing one or more basic nitrogen atoms attached to a silicon through at least 3 C atoms and (6) 0.01 to 0.5 part by weight tin in the form of a tin catalyst, characterized in that solutions of dialkyltin oxides corresponding to the following formula $$R^3_2SnO$$

in which $R^3$ may represent a linear or branched $C_3$–$C_{18}$ alkyl radical, in aminoalkyl alkoxysilanes are used.

It was surprising to find that the requisite combination of properties is obtained where the solution of dialkyl tin oxides in aminoalkyl alkoxysilanes is used in accordance with the invention.

Although dialkyltin oxides are already mentioned in the literature in another connection as catalysts for 1C RTV compositions, they have been hitherto unknown in practice, particularly in the production of oxime systems. It may be assumed that the reason for this lies above all in the poor solubility of the dibutyltin oxides in silicone oils. Accordingly, the use of the catalyst mixtures according to the invention in oxime systems had not been expected to reduce their corrosive effect on metals, particularly copper, nor to promote high stability in storage, for example by comparison with tin catalysts formed by heating of dialkyl tin dicarboxylates with alkoxysilanes with elimination of carboxylic acid esters.

The hydroxy- and trimethylsiloxy-terminated polydimethyl siloxanes mentioned as constituents (1) and (2) are known and are commercially available. In addition, the invention should also be applicable to polysiloxanes which, in addition to methyl groups, contain other substituents, for example phenyl groups.

Suitable oximinosilanes (3) are such compounds as

Suitable oximinosilanes (3) are such compounds as $CH_3Si[ON=C(C_2H_5)CH_3]_3$, $CH_2=CHSi[ON=C(C_2H_5)CH_3]_3$, $CH_3Si[ON=C(CH_3)_2]$, $C_2H_5Si(ON=CHCH_3)_3$, $Si[ON=C(C_2H_5)_2]_4$, $Si[ON=(CH_2CH_5)CH_3]_4$ and -continued

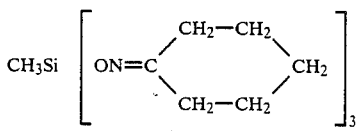

or mixtures of such silanes.

These compounds and their production are described in U.S. Pat. No. 3,189,576. Methyltris-(butanoneoximino)-silane is particularly preferred.

Suitable fillers (4) are reinforcing fillers, such as pyrogenic and precipitated silica, and non-discoloring or substantially non-discoloring mineral materials, such as carbonates (chalk, dolomite), silicates (clay, slate powder, mica, talcum, wollastonite), $SiO_2$ (quartz, diatomaceous earth) and also carbon black. The surfaces of the fillers may be modified by known hydrophobicizing agents, such as long-chain carboxylic acids and reactive silanes.

Suitable aminoalkyl alkoxysilanes (5) are such compounds as $H_2NCH_2CH_2CH_2Si(OC_2H_5)_3$, $H_2NCH_2CH_2NH-CH_2CH_2CH_2Si(OCH_3)_3$ and $H_2NCH_2CH_2CH_2SiCH_3(OC_2H_5)_2$. However, other aminoalkyl alkoxysilanes may also be used for the production of the compositions according to the invention. Many of these compounds have been described as primers or as crosslinking agents for silicone systems, cf. for example U.S. Pat. No. 3,888,815.

Suitable dialkyl tin oxides are such compounds as $(n-C_4H_9)_2SnO$, $(n-C_6H_{13})_2SnO$, $(n-C_8H_{17})_2SnO$ and $[C_4H_9(C_2H_5)CH]_2SnO$. Dibutyltin oxide and dioctyltin oxide are particularly preferred.

The solutions of the dialkyl tin oxides in aminoalkyl alkoxysilanes are obtained by mixing of the constituents and heating to around 150° C. At least 0.5 mol aminosilane must be used per mol dialkyltin oxide. An excess of aminosilane promotes the dissolving process. Although solvents may be used, they are not necessary.

In the production of the sealant, the aminoalkyl alkoxy silane may be completely added in the form of a solution of dibutyltin oxide in the silane itself. However, more silane may be added without any adverse effects. Total concentrations of aminoalkyl alkoxysilane of from 0.2 to 1.0%, based on the final sealant, are particularly preferred. The particularly preferred tin concentrations are between 0.05 and 0.15%.

As is normally the case with moisture-hardening silicone pastes, the compositions according to the invention may be prepared in planetary mixers, butterfly mixers, dissolvers, continuous mixing screws or other machines suitable for the production of pastes. The products are packed in hermetically sealable containers, for example cartridges. In the production process, contact with atmospheric moisture must be avoided as far as possible.

The compositions according to the invention may be used for bonds and coatings in contact with metals, particularly copper. Applications in the electronics field are mentioned as an example.

The invention is illustrated by the following Examples.

EXAMPLE 1

50.7 g dibutyl tin oxide are suspended under dry argon in 70.3 g 3-aminopropyl triethoxysilane and heated with stirring for 90 minutes to 150° C. The temperature was maintained for 30 minutes, resulting in the formation of a liquid from which no more solids precipitated on cooling.

EXAMPLE 2

62 parts by weight of an α,ω-dihydroxypolydimethyl siloxane having a viscosity of 50 Pa.s and 23.1 parts by weight of an α,ω-bis-(trimethylsiloxy)-polydimethyl siloxane having a viscosity of 0.1 Pa.s were mixed in a planetary mixer with 5.3 parts by weight $CH_3Si[ON=C(C_2H_5)CH_3]_3$ and with 8.4 parts by weight of a hydrophobicized pyrogenic silica (BET surface 110 m²/g). 0.7 part by weight $H_2NCH_2CH_2CH_2Si(OC_2H_5)_3$ and 0.35 part by weight of the solution obtained in Example 1 were then added.

To test its behavior with respect to copper, the composition was applied to a copper plate in the form of an approximately 1 cm thick bead. After 3 days, the copper surface showed no visibile change in color.

After hardening for 14 days at 25° C./50% relative air humidity, mechanical strength testing produced the following results (DIN 53 504):

| | |
|---|---|
| Hardness | 21 Shore A |
| E modulus | 0.47 N/mm² |
| Ultimate tensile strength | 1.5 N/mm² |
| Elongation at break | 450% |

In addition, the sealant was applied in the form of approximately 1 cm thick beads to glass, tile, aluminum, copper, rigid PVC and Makrolon plates. After hardening for 7 days, a test was conducted to determine whether the sealant tore off adhesively from the substrate. This was not the case with any of the substrates. A second series of comparable test plates was stored under water for 1 week at room temperature after hardening of the sealant. Even under these conditions, no adhesive tearing was observed.

To test its stability in storage, the paste was subjected to an accelerated test. In this test, the material was packed in tubes, stored at 100° C. and tested daily for incipient gelation and crosslinkability by expression of a small amount. After 6 days at 100° C., the selant had still not gelled and hardened satisfactorily to form an elastic vulcanizate.

EXAMPLES 3 to 5

The procedure was as in Example 2, except that the tin solutions and aminosilanes shown in Table 1 were used. The compositions of the tin solutions is shown in Table 2. The tests were carried out as decribed in Example 2. The results are shown in Table 1.

COMPARISON EXAMPLE 6

The procedure was as in Example 2, except that 0.9 part by weight 3-aminopropyl triethoxysilane was used and the tin solution according to the invention was replaced by 17 parts by weight of a catalyst mixture which had been prepared as follows:

21.8 g dibutyl tin dilaurate were heated for 1.5 hours to 150° C. with 78.2 g tetraethoxy silane. Thereafter, the laurate residues on the tin had reacted off substantially quantitatively to lawric acid ethyl ester (result Table 1).

COMPARISON EXAMPLE 7

The procedure was as in Example 2, except that 0.9 part by weight 3-aminopropyl triethoxysilane was used. 0.19 part by weight dibutyltin di-2-ethylhexanoate was used as catalyst instead of the tin solution according to the invention. In addition, 0.49 part by weight 2-ethylhexanoic acid was added as vulcanization accelerator (result Table 1).

COMPARISON EXAMPLE 8

The procedure was as in Example 7, except that the 2-ethyl hexanoic acid was omitted and the dibutyltin di-2-ethylhexanoate was replaced by 0.21 part by weight dibutyltin diacetate (result Table 1).

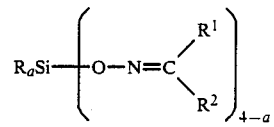

in which
R represents $C_1$–$C_4$ alkyl or alkenyl radicals

TABLE 1

The quantities are based on mixtures as in Example 1. The indicated quantities of tin solutions and aminosilanes were used instead of the tin solution of Example 1 and instead of the quantity of 3-aminopropyltriethoxysilane shown.

| | Tin solution | Aminosilane | Crosslinking after 6 days at 100° C. | Discoloration of the copper surface | Mechanical properties (DIN 53 504) | | |
|---|---|---|---|---|---|---|---|
| | | | | | TS | EB | E-mod |
| Example | | | | | | | |
| 3 | 0.37 part by weight A | 0.76 part by weight $H_2NCH_2CH_2CH_2Si(OC_2H_5)_3$ | yes | no | 1.3 | 420 | 0.44 |
| 4 | 0.35 part by weight B | 0.70 part by weight $H_2NCH_2CH_2CH_2SiCH_3(OC_2H_5)_2$ | yes | no | 1.3 | 440 | 0.43 |
| 5 | 0.35 part by weight C | 0.70 part by weight $H_2NCH_2CH_2NHCH_2CH_2CH_2Si(OCH_3)_3$ | yes | no | 1.6 | 590 | 0.41 |
| Comparison Example 6 | | | no | no | 1.5 | 410 | 0.51 |
| Comparison Example 7 | | | yes | yes | 1.0 | 230 | 0.55 |
| Comparison Example 8 | | | yes | yes | 1.5 | 470 | 0.46 |

TS = tensile strength in $N/mm^2$, EB = elongation at break in %, E mod = tensile stress at 100% elongation in $N/mm^2$

TABLE 2

Composition of the tin solutions of Examples 3 to 5:

A: 78 g dioctyltin oxide  50 g $H_2NCH_2CH_2CH_2Si(OC_2H_5)_3$
B: 51 g dibutyltin oxide  70 g $H_2NCH_2CH_2CH_2SiCH_3(OC_2H_5)_2$
C: 51 g dibutyltin oxide  70 g $H_2NCH_2CH_2NHCH_2CH_2CH_2Si(OCH_3)_3$

What is claimed is:

1. A polyorganosiloxane composition storable in the absence of moisture and which hardens in the presence of moisture, comprising a mixture of
   (1) 100 parts by weight of an α- -dihydroxypolydimethyl siloxane having a viscosity of 0.1 to 1000 Pas,
   (2) 0 to 100 parts by weight of an α-ω-bis(trimethylsiloxy)-polymethyl siloxane having a viscosity of 0.04 to 10 Pas as plasticizer,
   (3) 1 to 10 parts by weight of an oxyiminosilane having the following formula $R^1$ and $R^2$ each represent a $C_1$–$C_4$-alkyl radical or hydrogen or $R_1$ and $R^2$ together represent a $C_4$ or $C_5$ alkylene radical and a has the values 0 or 1,
   (4) 5 to 250 parts by weight of a reinforcing or non-reinforcing filler or filler mixture.
   (5) 0 to 2.5 parts by weight of an aminoalkyl alkoxy silane containing one or more basic nitrogen atoms attached to a silicon through at least 3 C atoms and
   (6) 0.01 to 0.5 parts by weight tin in the form of a tin catalyst, wherein the tin catalyst is a solution in an aminoalkyl alkoxy silane containing one or more basic nitrogen atoms attached to a silicon through at least 3 C atoms and of a dialkyltin oxide having the formula $$R^3_2SnO$$

in which
$R^3$ is a linear or branched $C_3$–$C_{18}$-alkyl radical, and wherein the solution of dialkyltin oxide comprises at least 0.5 mol aminosilane per mol dialkyltin oxide.

* * * * *